United States Patent
Ma

(10) Patent No.: US 6,850,451 B2
(45) Date of Patent: *Feb. 1, 2005

(54) ZERO STATIC POWER FUSE FOR INTEGRATED CIRCUITS

(75) Inventor: Fan Yung Ma, Singapore (SG)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/250,253

(22) Filed: Jun. 18, 2003

(65) Prior Publication Data

US 2003/0185081 A1 Oct. 2, 2003

Related U.S. Application Data

(63) Continuation-in-part of application No. 10/042,702, filed on Jul. 11, 2001.

(30) Foreign Application Priority Data

Jul. 4, 2002 (SG) .................. PCT/SG02/00152

(51) Int. Cl.⁷ .............................. G11C 7/00
(52) U.S. Cl. .................. 365/225.7; 365/189.05; 365/189.09
(58) Field of Search .............. 365/225.7, 189.09, 365/189.08, 189.05, 96

(56) References Cited

U.S. PATENT DOCUMENTS

| | | |
|---|---|---|
| 4,532,607 A | 7/1985 | Uchida |
| 4,922,134 A | 5/1990 | Hoffmann et al. |
| 5,047,664 A | 9/1991 | Moyal |
| 5,315,177 A | 5/1994 | Zagar et al. |
| 5,731,734 A | 3/1998 | Pathak et al. |
| 6,603,344 B2 * | 8/2003 | Yung .................. 327/525 |
| 2003/0011953 A1 * | 1/2003 | Yung .................. 361/104 |
| 2003/0185081 A1 * | 10/2003 | Ma .................. 365/225.7 |
| 2003/0189457 A1 * | 10/2003 | Ma .................. 327/525 |

FOREIGN PATENT DOCUMENTS

| | | |
|---|---|---|
| EP | 0 528 744 A3 | 2/1993 |
| EP | 0 528 744 A2 | 2/1993 |
| EP | 0 947 993 A2 | 10/1999 |
| EP | 0 947 993 A3 | 6/2000 |
| JP | 58105497 | 6/1983 |
| JP | 2000021191 | 1/2000 |

OTHER PUBLICATIONS

Kokkonen et al., "Redundancy Techniques for Fast Static RAMs", 1981 IEEE International Solid–State Circuits Conference, Feb. 18, 1981, p. 80–81.

"DC CMOS Fuse True/Complement Generator". IBM Technical Disclosure Bulletin; vol. 30; No: 12; May 1988, p. 61.

* cited by examiner

*Primary Examiner*—Richard Elms
*Assistant Examiner*—Hien Nguyen
(74) *Attorney, Agent, or Firm*—Horizon IP Pte Ltd

(57) ABSTRACT

A fuse cell with reduced or no static power dissipation is disclosed. The fuse cell utilizes a latch to store the state of the fuse. The use of the latch avoids having a pull-up power source being coupled to ground when the fuse is uncut as with conventional fuse cells. The fuse cell employs a control circuit connected to the latch and the fuse cell. When the control circuit receives an initialization signal, it sets the latch into a first state. When the initialization signal is removed, the control circuit couples the latch to the fuse circuit. In one of the latch's two states, the voltage the latch applies across the fuse is low (or zero). Conversely, if the latch takes the other state upon being coupled to the fuse, then the control circuit detects the state of the latch and in this case decouples the fuse from the latch circuit.

29 Claims, 8 Drawing Sheets

ZERO STATIC POWER FUSE FOR INTEGRATED CIRCUITS

CROSS REFERENCE TO RELATED APPLICATIONS

This application claims priority of international application, titled "Zero Static Power Fuse Cell for Integrated Circuits", PCT/SG02/00152 filed on Jul. 4, 2002 and is a continuation-in-part of patent application, titled "Zero Static Power Fuse Cell for Integrated Circuits", U.S. Ser. No. 10/042,702 filed on Jul. 11, 2001.

BACKGROUND OF INVENTION

Fuse cells are widely used in ICs in order to make the ICs tunable. For example, after an IC designed by an IC supplier is manufactured it may happen that, due to the manufacturing process, the performance of the ICs is not what was intended. In this case, the performance of the ICs can be modified by cutting a selection of the fuses before the ICs are supplied to customers. As an example, fuse cells can be used to store addressing information of defective memory cells in an array for redundancy applications.

When the IC supplier contemplates cutting the fuses of an IC it may wish to check that the resulting performance of the IC will be what is desired. For that reason, it is known to provide circuitry on the IC for simulating the cut and uncut fuse states and which is controllable using control signals. Control signals are applied to the circuit to cause this circuitry to simulate the proposed cutting of fuses, and the performance of the IC is then investigated.

FIG. 1 shows a conventional fuse cell 101 comprising a pull-up circuit. As shown, a fuse 110 is coupled between the pull-up (logic 1 or high) power source and ground (logic 0 or low). Coupled between the fuse and the pull-up power source is a fuse cell output terminal 160. The output signal of the fuse cell indicates the state of the fuse (cut or uncut). A cut fuse produces a logic 1 output while an uncut fuse produces a logic 0 output.

When the fuse is not cut, the pull-up power source is coupled to ground via the fuse 110. Thus, even when the fuse is in a static state, power dissipates through the fuse which increases the IC's power consumption. The increased power consumption is undesirable, particularly for low power applications.

An additional desideratum for a fuse cell of an integrated circuit is that when it is in the cut state the voltage across it is low. In this case, deep sub-micron technologies provide leakage paths across cut (or "blown") fuses due to corrosion and applied electrical voltage bias. For this reason, it is a design requirement of certain deep sub-micron technologies (e.g. ones having 180 nm or 130 nm lithographic resolution) that the bias across the blown fuse links be less than 0.1V, this being the maximum voltage allowed to prevent leakage path formation.

When a fuse cell is implemented using the traditional pull-up circuit as described above, the requirement for a low voltage bias in the cut state would have to be implemented with additional circuitry to minimise or eliminate the static power distribution through the uncut fuse. The 0.1V bias requirement means that the additional circuitry is required to identify the cut fuse state, latch and store the fuse state and then isolate the fuse element so that no bias exceeding 0.1V is present across the cut fuse. This would increase the complexity and area of each fuse cell. In applications where many fuses are needed there can be a considerable area penalty.

As evidenced from the above discussion, it is desirable to provide an improved fuse cell with reduced or no static power dissipation, and preferably with a low (or zero) bias across the fuse cell in the case that the fuse cell is cut.

SUMMARY OF INVENTION

The present invention seeks to provide a new and useful fuse cell, and devices incorporating the fuse cell.

In particular, preferred embodiments of the fuse cell have reduced or no static power consumption.

Certain embodiments of the invention further have reduced or no bias across the fuse cell in the case that it is cut.

In general terms, the invention proposes that a fuse cell utilizes a latch to store the state of the fuse. The use of the latch avoids having a pull-up power source being coupled to ground when the fuse is uncut as with conventional fuse cells.

Upon receiving an initialisation signal, the fuse cell sets the latch into a first state. When the initialisation signal is removed, the latch is coupled to the fuse circuit.

Preferably, in one of the latch's two states, the voltage the latch applies across the fuse is low (or zero). Typically, the latch is put into this state when the fuse is in the uncut state. Optionally, when the latch takes the other state upon being coupled to the fuse (because of the state of the fuse), the fuse is subsequently decoupled from the latch circuit.

In one embodiment, the fuse cell includes a control circuit, a fuse circuit, an initialization circuit and a latch. The control circuit is coupled to the latch, fuse circuit and initialization circuit. In response to an active initialization signal, the control circuit couples the latch to the initialization circuit. The initialization circuit sets the latch to a first state. After the fuse cell is initialized, the initialization signal is deactivated which causes the control circuit to operate in the normal operating mode. In the normal operating mode, the initialization circuit is decoupled from the latch while the fuse circuit is coupled to the latch. Depending on the fuse state, the latch remains in the first state or is switched to a second state.

Typically, in the case that the fuse is in the uncut state, the latch assumes (or remains in) a state in which the voltage across the fuse is low or zero. Thus, the present invention makes it possible to avoid a voltage drop across the uncut fuse.

Preferably, the control circuit includes a switching circuit which is sensitive both to the initialization signal and the output of the latch. When (at a time that the initialization signal is not applied), the latch is in a state indicative of the fuse being cut, the switching circuit removes (or at least reduces) the bias across the fuse circuit, for example by shorting out the fuse circuit.

A software programmable fuse circuit may be provided at the output of the latch. According to control signals it receives, the software programmable fuse circuit may either transmit a signal determined by the latch output, or alternatively transmit a signal determined by the control signals.

A plurality of fuse cells as described above may be provided on an IC. Optionally, the software programmable fuse circuits for these respective fuse cells may be combined as a single block on the IC with the rest of each of the fuse cells as a separate block.

BRIEF DESCRIPTION OF DRAWINGS

Non-limiting examples of the invention will now be described with reference to the following figures in which.

DETAILED DESCRIPTION

Figure 1:
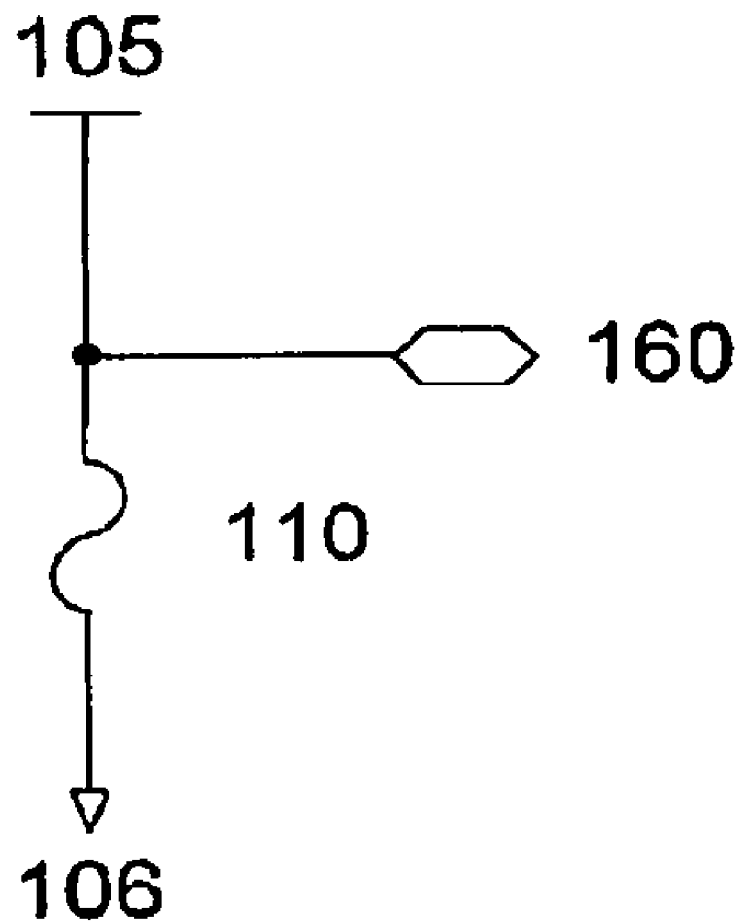
FIG. 1 shows a conventional fuse cell.
Figure 2:
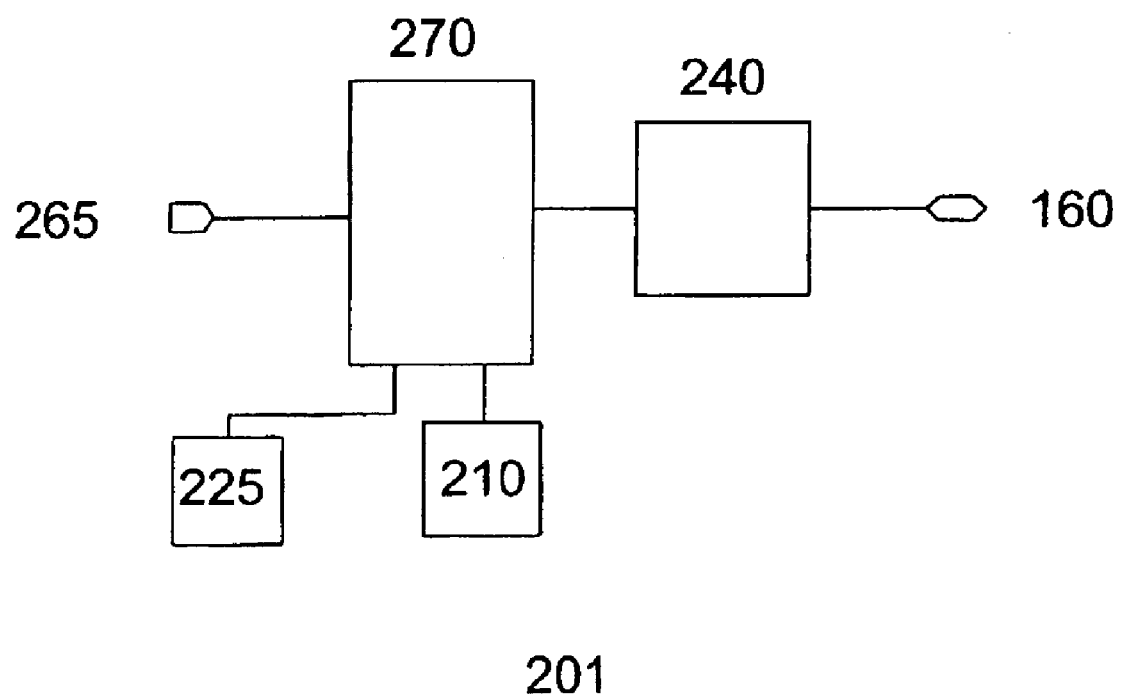
FIG. 2 is a block diagram of a fuse cell which is an embodiment of the invention.

FIG. 2 shows a block diagram of an embodiment of the invention which is a fuse cell 201 having a reduced or no static power dissipation. In accordance with the invention, static power dissipation is avoided or reduced by using a latch 240, which is coupled to a fuse 210, to store or generate information related to the state of the fuse. The information is provided at a fuse cell output terminal 160 coupled to the latch. A control circuit 270 is coupled to the fuse and the latch. The control circuit includes an input terminal 265 for receiving a fuse reset or control signal to initialize the fuse.

To initialize the fuse cell, an active init signal is provided at the input terminal. In one embodiment, the active init signal comprises an active low (logic 0) signal. The init signal, for example, can be the power-on reset signal. During initialization, the latch is decoupled from the fuse and set to a known state or logic level (first state). The init signal is then inactivated (e.g., logic 1) after initialization is completed. Inactivating the init signal couples the latch 240 to the fuse 210. Depending on whether the fuse is cut or uncut, the latch remains at the first state or is flipped to the second state.

In one embodiment, the latch is initialized to store a logic 1, producing a logic 1 output. A cut fuse does not affect the state of the latch (or the fuse cell output) while an uncut fuse causes the latch state to switch from a logic 1 to a logic 0. The switch in logic level in the case of an uncut fuse is due to the fact that the fuse is coupled to ground. By using the latch, the present invention avoids having a pull-up power source being connected to ground when the fuse is uncut, as in the case of conventional fuse cells, thereby reducing or eliminating static power dissipation.

Figure 3:
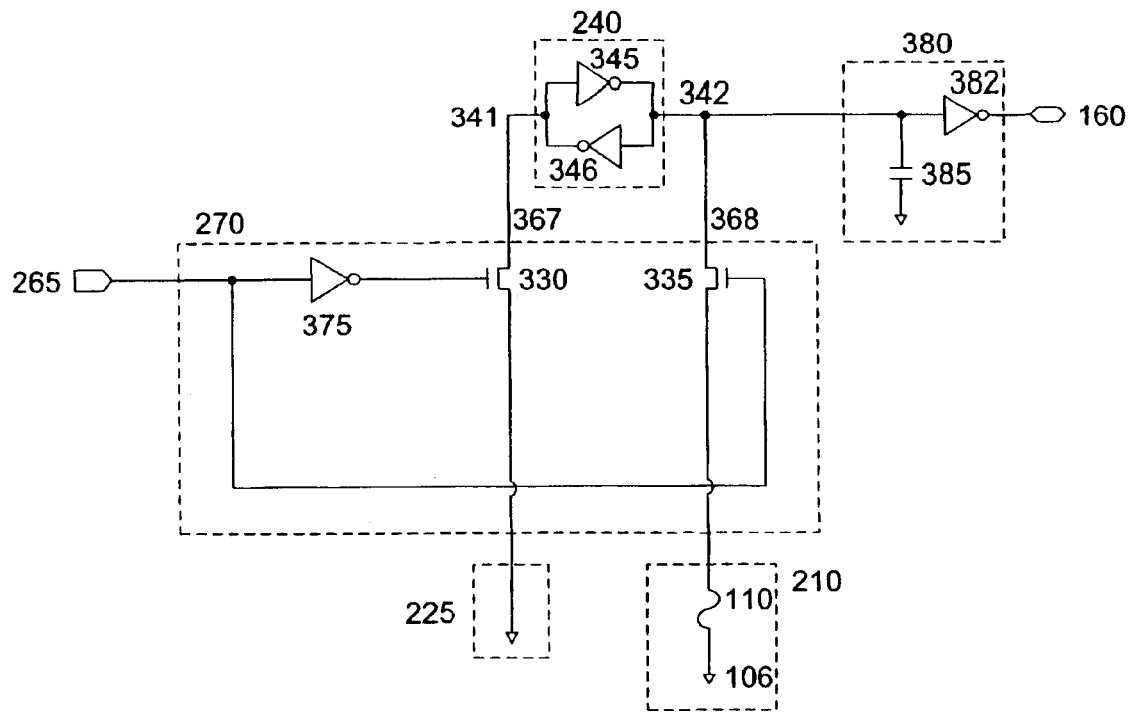
FIG. 3 is a circuit diagram of a first realisation of the embodiment of FIG. 2.

Referring to FIG. 3, a fuse cell in accordance with one embodiment of the invention is shown. The fuse cell comprises a control circuit 270, a latch 240, an initialization circuit 225, and a fuse circuit 210. The latch includes first and second terminals 341 and 342 which are commonly coupled to first and second inverters 345 and 346 back-to-back. The first and second latch terminals are coupled to output terminals 367 and 368 of the control circuit.

In one embodiment, the control circuit comprises first and second transistors 330 and 335. The transistors, for example, are n-FETs. First and second terminals of the first transistor 330 are coupled to the first terminal 341 of the latch and the initialization circuit 225. In one embodiment, the initialization circuit 225 comprises a pull-down power source such as ground. The second transistor's first and second terminals are coupled to the second terminal 368 of the latch 240 and the fuse circuit 210. In one embodiment, the fuse circuit 210 comprises a fuse 110 coupled to ground 106. The gates of the transistors 330, 335 are coupled to the input terminal of the control circuit 270 or through an inverter 375. The first and second transistors 330, 335 operate in a push-pull configuration. That is, one transistor is on (conductive) while the other is off (non-conductive). In one embodiment, an inverter 375 is located between the input terminal 265 and the first transistor 330, causing the n-FETs to operate in a push-pull configuration.

The fuse cell is initialized by providing an active low input signal. The active low signal switches the first transistor 330 on and the second transistor 335 off, coupling the first terminal 341 of the latch 240 to the initialization circuit and decoupling the second terminal 342 of the latch 240 from the fuse circuit. This causes the latch 240 to be initialized to a logic 1 state (i.e., first latch terminal 341 is low while the second latch terminal 342 is high). After the latch is initialized, the input signal is inactivated (logic 1) to decouple the first terminal 341 of the latch from ground and to couple the second terminal 342 of the latch to the fuse circuit 210. If the fuse 110 is cut, the latch remains unchanged. An uncut fuse causes the second terminal 342 of the latch to be coupled to ground via the fuse 110, switching the state of the latch from a logic 1 to a logic 0.

Figure 4:
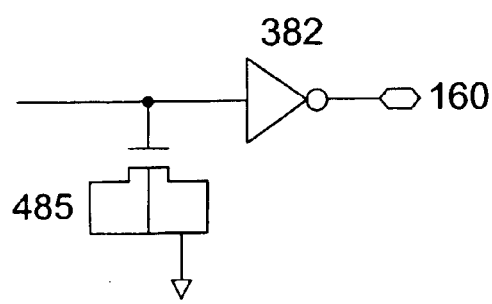
FIG. 4 shows an alternative form of a portion of the fuse cell of FIG. 3.

In one embodiment, an output stage 380 is coupled between the second terminal 342 of the latch and fuse cell output terminal 160. The output stage comprises a capacitor 385 coupled between the output terminal 342 and ground. In an alternative embodiment, as shown in FIG. 4, the output stage 480 comprises a CMOS capacitor 485 such as a p-FET. The capacitor serves to stabilize the fuse cell output from glitches. An inverter 382 may optionally be provided to switch the logic of the fuse cell output signal.

Figure 5:
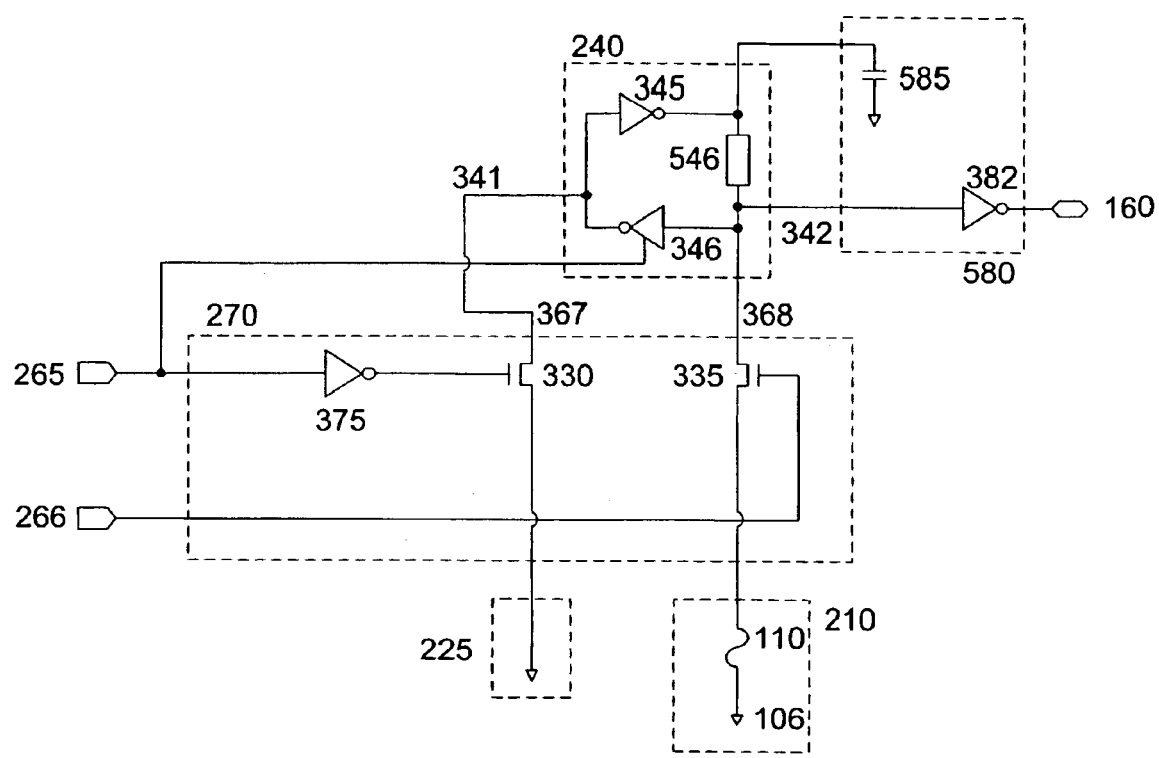
FIG. 5 is a circuit diagram of a second realisation of the embodiment of FIG. 2.
Figure 6:
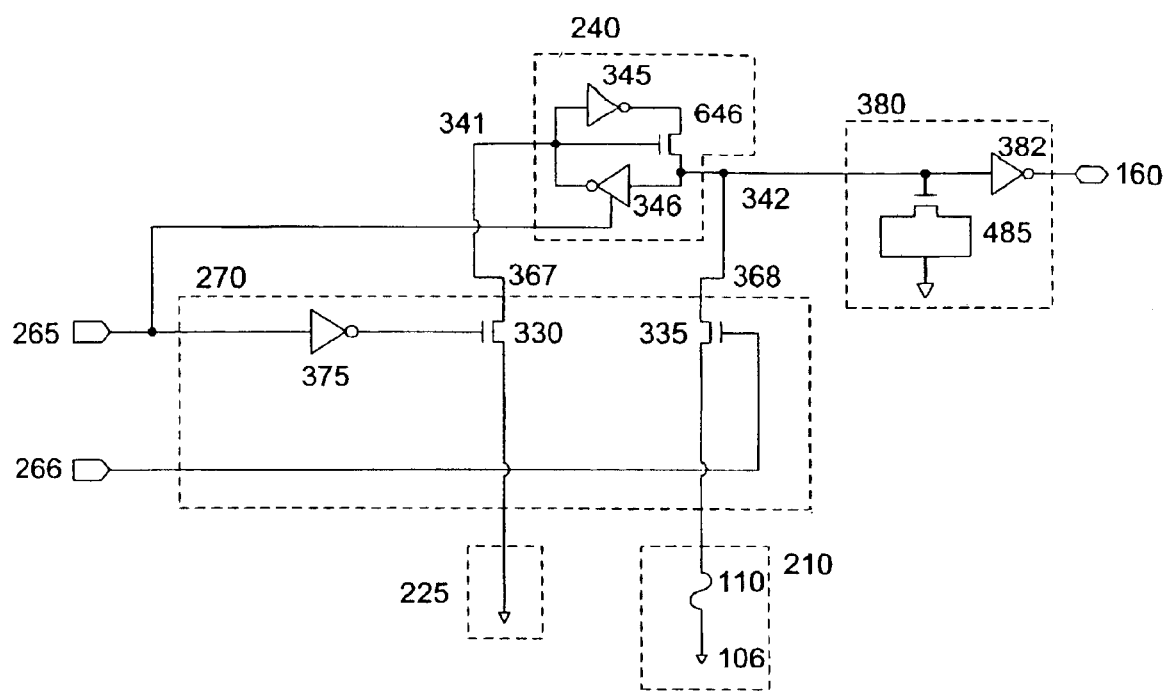
FIG. 6 is a circuit diagram of a third realisation of the embodiment of FIG. 2.

FIG. 5 shows a fuse cell in accordance with another embodiment of the invention. The fuse cell, as shown, provides a valid fuse state during initialization. This is particularly useful for applications which require a valid fuse output during power-up (e.g., power supply under-voltage detection applications). The fuse cell comprises a latch 240, a control circuit 270, an initialization circuit 225, and a fuse circuit 210. To enable a valid fuse output signal even during power-up, the control circuit couples the fuse to the latch at least from the time the IC is powered up. This enables a valid fuse cell output even during initialization. A resistor 546 is provided between the output of the first latch inverter 345 and power source 106 of the fuse to reduce power dissipation during initialization if the fuse 110 is uncut. Alternatively, a transistor 646, such as a p-FET, as shown in FIG. 6 can serve as a resistive element.

In one embodiment, the latch includes first and second terminals 341 and 342 which are commonly coupled to first and second inverters 345 and 346 back-to-back. A resistor 546 is also commonly coupled to the inverters (e.g., output terminal of the first inverter and input terminal of the second inverter) and the second latch terminal.

The first and second latch terminals are coupled to output terminals 367 and 368 of the control circuit. The control circuit comprises first and second transistors 330 and 335. The transistors, for example, are n-FETs. First and second terminals of the first transistor are coupled to the first terminal 341 of the latch and the initialization circuit 225. The first and second terminals of the second transistor 335 are coupled to the second terminal 342 of the latch and the fuse circuit 210.

The first transistor 330 and the second inverter 346 of the latch operate in a push-pull configuration. That is, when one is on, the other is off. In one embodiment, the second latch inverter 346 and the first transistor 330 are controlled by the input signal at the input terminal 265 of the control circuit (init signal). In one embodiment, the second inverter 346 is coupled to the input terminal 265 while an inverter 375 is located between the input terminal 265 and the gate of the first transistor 330, causing the first transistor 330 and the second inverter 346 to operate in a push-pull configuration. The second transistor 335 is controlled by inverted init signal from input 266, which is used to control the first transistor 330.

The fuse cell is initialized by providing an active low input signal, for example, an init signal during power-up. The active low signal switches the first transistor 330 on and the second inverter 346 off, coupling the first terminal 341 of the latch to the logic 0 power source. At the same time, an active signal (logic 1) is provided at input terminal 266 to switch on the second transistor 335 in order to couple the latch 240 to the fuse 110. By switching off the second inverter 346 during initialization, the second terminal 342 is decoupled from the first terminal 341 to avoid conflict between the first and second latch terminals caused by an uncut fuse.

The logic 0 power source 225 causes the latch to produce a logic 1 signal at the output of inverter 345. Since the fuse is coupled to this point via the resistor 546, a valid fuse cell output is provided at the second terminal 342 during initialization. If the fuse is cut, the fuse output is a logic 1, otherwise the fuse output is a logic 0.

After the initialization phase is completed, the init signal is inactivated (logic 0) while the control signal at input terminal 266 remains active. This decouples the logic 0 power source 225 from the latch 240 and activates the second inverter 346. An optional output stage, as described in FIGS. 3 and 4, may be provided between the second terminal of the latch and the fuse cell output terminal. Alternatively, as shown in FIG. 5, one terminal of capacitor 585 of the output stage 580 is commonly coupled to the resistor 546 and first inverter 345 of the latch while the other terminal is coupled to ground.

Figure 7:
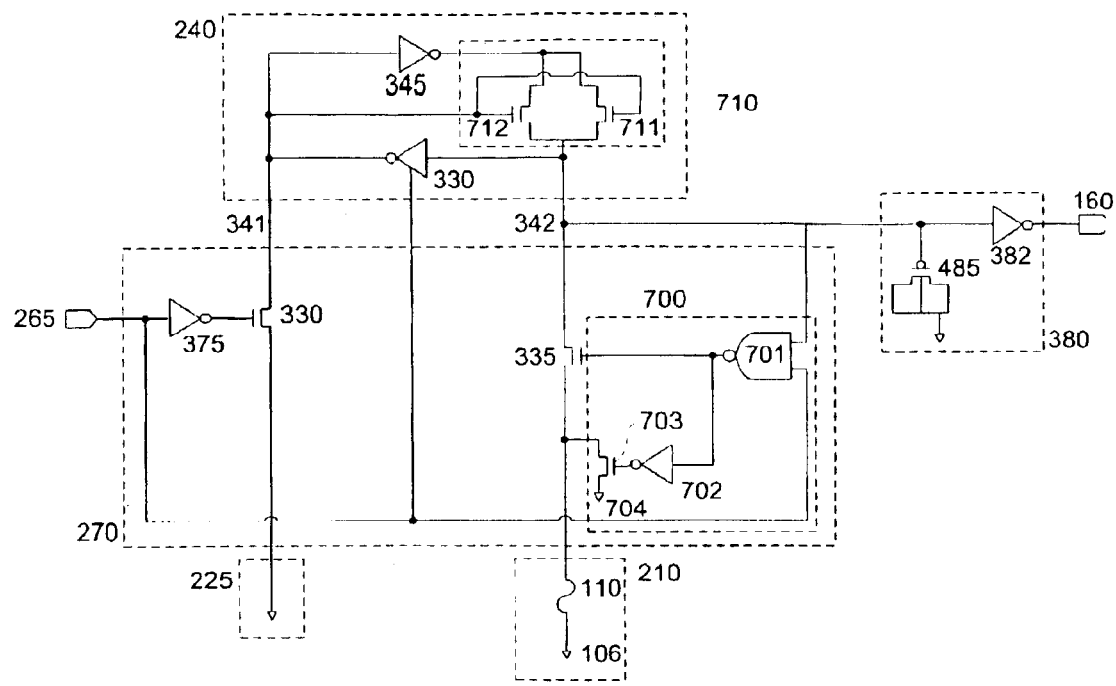
FIG. 7 is a circuit diagram of a fourth realisation of the embodiment of FIG. 2.

The embodiments of the invention discussed above achieve one of the preferred advantages of the invention, namely that there is reduced or no static power dissipation. FIG. 7 describes a further embodiment of the invention which, in addition to providing reduced or no static power dissipation, provides an additional preferred advantage of the invention: a low (or zero) bias across the fuse cell in the case that the fuse cell is cut.

The overall structure of the embodiment is as shown in FIG. 2, and since many of the features of the embodiment resemble those of FIG. 6, the same reference numerals are mainly used.

The most significant difference between FIG. 6 and FIG. 7 is that the control circuit 270 of the fuse cell of FIG. 7 additionally includes a switching circuit 700, which replaces the input 266, and is coupled to the input terminal 265 and the output terminal 342 of the latch 240.

The switching circuit 700 includes a NAND gate 701 which receives both the initialization signal from the input terminal 265 and also the output of the latch 240 from the output terminal 342. If either of these two inputs is low (i.e. indicating, in the case that the initialization signal is low, that the control circuit 270 is in the initialization phase, and in the case that the latch output is low that the fuse is uncut), the NAND gate 701 produces a positive output, and the transistor 335 is turned on.

However, in the case that both the inputs to NAND gate 701 are positive (indicating both that the control circuit is in the normal state, and that the fuse 110 is cut), the NAND gate 701 produces a logic 0 output, turning the transistor 335 off. The output of the NAND gate 701 is transmitted also to the inverter 702, which in this case, and in this case only, produces a logic 1 signal to turn on the transistor 703, and thereby connect the fuse circuit 210 to a power source 704 which is at substantially the same voltage as the power source 106 (for example, they may both be grounded). The transistor 703 turns on after the transistor 335 turns off, so the output 342 is never connected to the power source 704.

A second difference between the circuit of FIG. 6 and that of FIG. 7 is that the transistor 646 is replaced with a transistor circuit 710, having a PMOS transistor 712 and an NMOS transistor 711. The PMOS 712 is a weak device designed just to limit the current. The NMOS 711 is used as a switch element.

The steps in the operation of the embodiment will now be described.

During the initialization phase the signal at terminal 265 is logic 0, so that the transistors 330, 335 are turned on. This pulls the input terminal 341 of the latch 240 to logic 0. The output of inverter 345 thus becomes logic 1. Since PMOS 712 is on (NMOS 711 is off), the voltage at output terminal 342 will depend on the fuse state.

If the fuse is uncut, the voltage at output terminal 342 will become logic 0, since the output terminal 342 is connected to power supply 106 through the fuse 110. PMOS 712 will be in the saturation region with gate and drain at ground-potential. This provides a voltage drop (level shift) between the output of the inverter 345 and the output terminal 342, and serves to limit the current drain in the fuse low impedance path.

If the fuse is cut, there is no low impedance path from terminal 342 to power source 106, PMOS 712 will be in the "linear region", and terminal 342 will be pulled high, to logic 1.

During the latch phase, the initialization signal at terminal 265 is logic 1, so the inverted 346 is enabled to activate the latch comprising back-to-back inverters 345 and 346.

If the fuse is uncut, terminal 341 will be pulled high (logic 1) by the inverter 346, and the output of inverter 345 will therefore be low (logic 0) and the PMOS 712 will be turned off and the NMOS 711 in the "linear region". In this case, the output of the NAND gate is logic 1, and the transistor 335 is turned on. The transistor 702 is turned off, since there is no need to force any bias condition onto the fuse 110; the voltage across the fuse 110 is low in any case since the output terminal 342 is low. Since the low impedance path from terminal 342 to ground is maintained, there is no sensitivity to timing of the turning off of the transistor 330 and the enabling of the inverter 346. Inverter 382 isolates the fuse internal nodes from the external loading. PMOS transistor 485 operates as an accumulation mode capacitor so that in the case of a cut-fuse, terminal 342 is held in the logic 1 state in the event of a short duration power supply glitch.

However, if the fuse is cut, all the voltages remain unchanged. To ensure that there is zero bias across the fuse 110, the NAND gate 701 outputs logic 0, so that the transistor 335 is turned off. Transistor 703 is turned on, to pull the terminal of the fuse circuit 210 to which it is connected to substantially the same voltage as the power source 106, so that there is substantially zero bias across the blown fuse link.

Thus, in either case, once the latch state has been reached, the fuse cell dissipates very little static power (only leakage currents), and zero (or near-zero) bias is ensured for any cut fuse link. In the case of a cut fuse, to guard against the terminal 342 voltage being lower due to the effects of leakage currents (through NMOS 335 during the initialization phase) these transistors are selected to have relatively long channel lengths.

Figure 8:
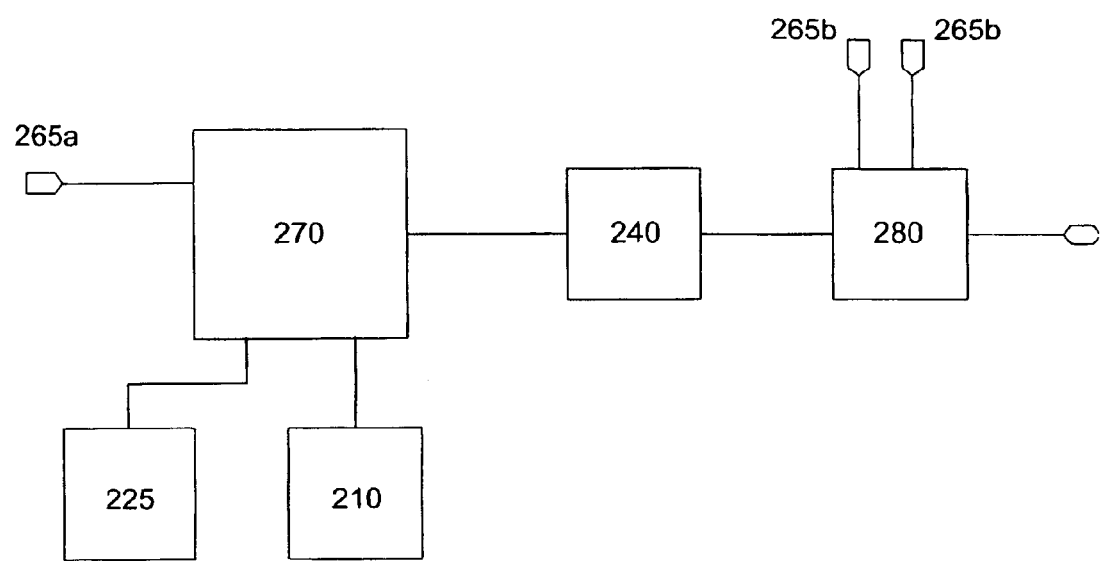
FIG. 8 is a block diagram of an alternative form of the invention.

Turning now to FIG. 8, a further embodiment of the invention is shown. In this embodiment the control circuit 270 receives only an init signal through input terminal 265a, and the software programmable fuse circuit 280 is instead located at an output of the latch 240, where according to the control signals the fuse circuit receives it can either operate in a first operating mode in which it transmits the output of the latch 240 to its own output, or else in a second operating mode in which it ignores the output of the latch 240 and instead outputs a signal determined based on the inputs 265b. The form of the control circuit 270 in this case may be the same as any of the control circuits according to the invention described earlier.

Figure 9:
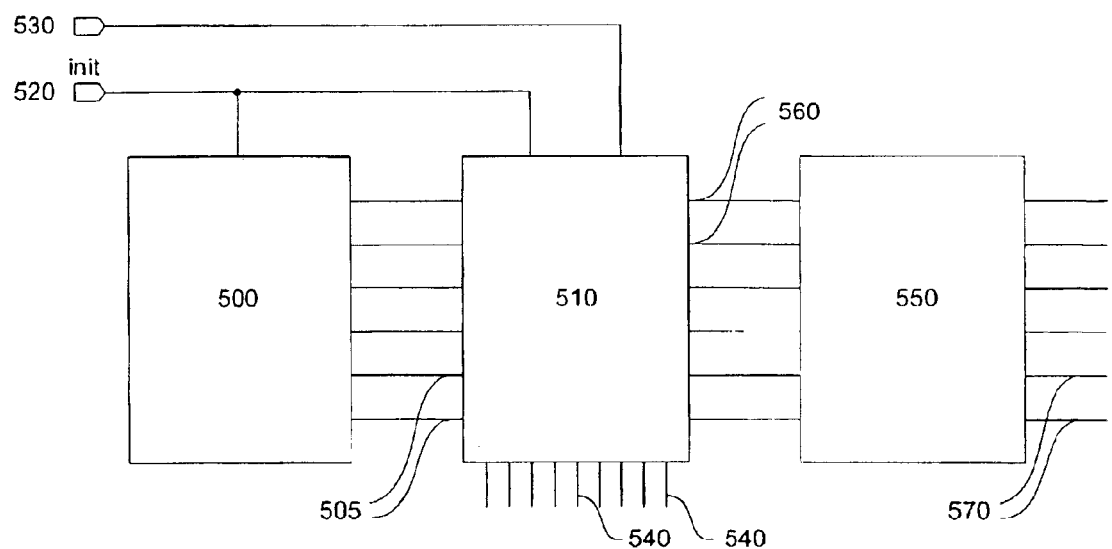
FIG. 9 shows the structure of an embodiment of the invention according to FIG. 8.

FIG. 9 shows a block diagram of an arrangement in which there are 10 fuse cells of the form shown in FIG. 8. The control circuits 270, fuse circuits 210 and latches 240 of each of these 10 fuse cells are located in a fuse block 500. The software programmable fuse circuits 280 of each of the 10 fuse cells are located in a softfuse block 510. The respective latches 240 and software programmable fuse cells are connected by leads 505. An init signal is received at a terminal 520 and transmitted to both the fuse block 500 and softfuse block 510. A software block enable signal is transmitted to each software programmable fuse circuit 280 from an input 530, which tells the software programmable fuse circuits whether to transmit the outputs of the respective latches 240 or alternatively to simulate a fuse state. Each of the software programmable fuse circuits 280 receives a respective input signal from a respective input 540 which tells it which fuse state to simulate in the case that the input 530 indicates that simulation is to be done.

Optionally, the softfuse block may not be enabled (i.e. even if the input 530 indicated that simulation is to be done, the softfuse block 510 may actually output the signals which it receives from the fuse block 500) in the case when the init signal indicates that the fuse block is in the initiation stage. This is because at such moments (e.g. during power-up) the inputs 540 may not be well defined.

A buffer block 550 is provided, having a respective buffer for each fuse. A lead 560 transmits the output of the respective software programmable fuse circuit 280 to this buffer. The buffer can then output it through a respective output 570.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope, of equivalents.

What is claimed is:

1. A fuse cell comprising:
   an input terminal for receiving an input signal;
   an output terminal;
   a control circuit coupled to the input terminal;
   an initialization circuit coupled to the control circuit;
   a fuse circuit coupled to the control circuit, the fuse circuit comprises a fuse having an uncut or a cut fuse state; and
   a latch coupled to the output terminal and the control circuit;
   according to an input signal at the input terminal, the control circuit operating in an initialization mode in which it couples the initialization circuit to the latch to put the latch into a first state, or operating in normal mode in which it couples the fuse circuit to the latch, wherein the latch, depending on the state of the fuse, remains in the first state or switches to the second state.

2. A fuse cell according to claim 1 in which, when the control circuit operates in the normal mode and the fuse is in the uncut state, the latch takes a state in which the voltage bias across the fuse circuit is substantially zero.

3. A fuse cell according to claim 1 in which the control circuit further comprises a switching circuit receiving an output of the latch, and the switching circuit is arranged, upon the latch indicating that the fuse is in the out state when the control circuit operates in the normal mode, to remove the bias across the fuse circuit.

4. A fuse cell according to claim 1 in which the switching circuit removes the bias across the fuse circuit by firstly decoupling the fuse circuit from the latch circuit, and subsequently shorting out the fuse circuit.

5. A fuse cell comprising:
   an input terminal for receiving an input signal;
   an output terminal;
   a control circuit coupled to the input terminal;
   an initialization circuit coupled to the control circuit;
   a fuse circuit coupled to the control circuit, the fuse circuit comprises a fuse having an uncut or a cut fuse state; and
   a latch coupled to the output terminal and the control circuit;
   in response to an input signal at the input terminal, the control circuit causes the fuse cell to operate in either an initialization mode or a normal mode, wherein in the normal mode, the latch is either in a first or second latch state, causing an output signal at the output terminal to either be in a first or second output signal state to indicate that the fuse is in the cut or uncut state.

6. The fuse cell of claim 5 wherein the control circuit couples the fuse circuit to the latch in the normal mode, wherein the latch, in the normal mode, switches from the first latch state to the second latch state or remains in the first latch state depending on whether the fuse is in the cut or uncut state.

7. The fuse cell of claim 5 wherein the control circuit couples the initialization circuit to the latch in the initialization mode, the initialization circuit initializes the latch to the first latch state in the initialization mode.

8. The fuse cell of claim 7 wherein the control circuit couples the fuse circuit to the latch in the normal mode, wherein the latch, in the normal mode, switches from the first latch state to the second latch state or remains in the first latch state depending on whether the fuse is in the cut or uncut state.

9. The fuse cell of claim 5 wherein the control circuit comprises a bias circuit to reduce the bias across the fuse circuit when the fuse is in the cut state.

10. The fuse cell of claim 9 wherein the bias circuit comprises a switching circuitry for selectively coupling a bias voltage between the control circuit and the fuse circuit when the fuse is in the cut state.

11. The fuse cell of claim 10 wherein the fuse reference voltage and the bias voltage are substantially equal.

12. The fuse cell of claim 10 wherein the fuse reference voltage and the bias voltage are substantially equal to ground.

13. The fuse cell of claim 9 wherein the bias circuit comprises a switching circuitry for selectively coupling a bias voltage between the control circuit and fuse circuit when the fuse is in the cut state and the fuse cell is operating in the normal mode.

14. The fuse cell of claim 13 wherein the fuse reference voltage and the bias voltage are substantially equal.

15. The fuse cell of claim 13 wherein the fuse reference voltage and the bias voltage are substantially equal to ground.

16. The fuse cell of claim 13 wherein the switching circuitry comprises:
a nand gate having first and second nand input terminals and a nand output terminal, the first nand input terminal coupled to the input terminal of the fuse cell and the second nand input terminal coupled to the output terminal of the fuse cell;
an inverter having an inverter input terminal and an inverter output terminal, the inverter input terminal coupled to the nand output terminal; and
a bias voltage transistor, the bias voltage transistor having first and second bias transistor terminals and a gate terminal, the first bias transistor terminal coupled to the fuse circuit, the second bias transistor coupled to the bias voltage and the gate terminal coupled to the inverter output terminal.

17. The fuse cell of claim 16 wherein the fuse reference voltage and the bias voltage are substantially equal.

18. The fuse cell of claim 16 wherein the fuse reference voltage and the bias voltage are substantially equal to ground.

19. The fuse cell of claim 9 wherein:
the fuse comprises first and second fuse terminals, the first fuse terminal is coupled to a fuse reference voltage and the second fuse terminal is coupled to a control fuse terminal of the control circuit; and
the bias circuit is coupled to the control fuse terminal.

20. The fuse cell of claim 19 wherein the bias circuit comprises a switching circuitry for selectively coupling a bias voltage between the control circuit and fuse circuit when the fuse is in the cut state.

21. The fuse cell of claim 20 wherein the fuse reference voltage and the bias voltage are substantially equal.

22. The fuse cell of claim 20 wherein the fuse reference voltage and the bias voltage are substantially equal to ground.

23. The fuse cell of claim 19 wherein the bias circuit comprises a switching circuitry for selectively coupling a bias voltage between the control circuit and fuse circuit when the fuse is in the cut state and the fuse cell is operating in the normal mode.

24. The fuse cell of claim 23 wherein the fuse reference voltage and the bias voltage are substantially equal.

25. The fuse cell of claim 23 wherein the fuse reference voltage and the bias voltage are substantially equal to ground.

26. The fuse cell of claim 23 wherein the switching circuitry comprises:
a nand gate having first and second nand input terminals and a nand output terminal, the first nand input terminal coupled to the input terminal of the fuse cell and the second nand input terminal coupled to the output terminal of the fuse cell;
an inverter having an inverter input terminal and an inverter output terminal, the inverter input terminal coupled to the nand output terminal; and
a bias voltage transistor, the bias voltage transistor having first and second bias transistor terminals and a gate terminal, the first bias transistor terminal coupled to the fuse circuit, the second bias transistor coupled to the bias voltage and the gate terminal coupled to the inverter output terminal.

27. The fuse cell of claim 26 wherein the fuse reference voltage and the bias voltage are substantially equal.

28. The fuse cell of claim 26 wherein the fuse reference voltage and the bias voltage are substantially equal to ground.

29. A fuse cell comprising:
an input terminal for receiving an input signal;
an output terminal;
a control circuit coupled to the input terminal;
an initialization circuit coupled to the control circuit;
a fuse circuit coupled to the control circuit, the fuse circuit comprises a fuse having an uncut or a cut fuse state; and
a latch coupled to the output terminal and the control circuit;
in response to an input signal at the input terminal, the control circuit causes the fuse cell to operate in either an initialization mode or a normal mode, wherein in the normal mode, the latch is either in a first or second latch state, causing an output signal at the output terminal to either be in a first or second output signal state to indicate that the fuse is in the cut or uncut state; and
a bias circuit within the control circuit, the bias circuit reduces a bias across the fuse circuit when the fuse is in the cut state.

* * * * *